(12) United States Patent
Correia et al.

(10) Patent No.: US 6,441,632 B1
(45) Date of Patent: Aug. 27, 2002

(54) SPRING PROBE CONTACTOR FOR TESTING PGA DEVICES

(75) Inventors: George C. Correia, Essex Junction; Howard F. Garcia, St. Albans, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,450

(22) Filed: Apr. 9, 2001

(51) Int. Cl.[7] ................................................. G01R 31/02
(52) U.S. Cl. ...................... 324/761; 324/754; 324/758
(58) Field of Search .................... 324/755, 758, 324/761, 754, 537; 439/482

(56) References Cited

U.S. PATENT DOCUMENTS

| 3,728,667 A | | 4/1973 | Richelmann |
| 4,686,464 A | | 8/1987 | Elsasser et al. |
| 4,773,877 A | | 9/1988 | Kruger et al. |
| 4,816,754 A | | 3/1989 | Buechele et al. |
| 5,147,213 A | | 9/1992 | Funk et al. |
| 5,385,477 A | | 1/1995 | Vaynkof et al. |
| 5,451,883 A | * | 9/1995 | Staab .......................... 324/758 |
| 5,521,522 A | | 5/1996 | Abe et al. |
| 5,532,613 A | | 7/1996 | Nagasawa et al. |
| 5,534,787 A | * | 7/1996 | Lavy ........................... 324/761 |
| 5,575,076 A | | 11/1996 | Creeden |
| 5,945,837 A | | 8/1999 | Fredrickson |
| 5,955,888 A | | 9/1999 | Frederickson et al. |
| 5,982,186 A | | 11/1999 | Buschbom |
| 6,118,290 A | | 9/2000 | Sugiyama et al. |
| 6,160,412 A | | 12/2000 | Martel et al. |
| 6,300,781 B1 | * | 10/2001 | Yap et al. .................... 324/755 |

FOREIGN PATENT DOCUMENTS

| JP | 5-55315 | 8/1991 |
| JP | 11-94894 | 4/1999 |
| SE | 8605085-3 | 5/1988 |

* cited by examiner

*Primary Examiner*—Michael Sherry
*Assistant Examiner*—Paresh Patel
(74) *Attorney, Agent, or Firm*—Robert A. Walsh

(57) ABSTRACT

A spring probe (pogo pin) contactor for testing semiconductor devices with pogo pins within a spring probe contactor is disclosed. The contactor device has a plurality of pogo pins extending therefrom for testing the semiconductor device. A surface of the spring pogo pin contactor has an array of apertures for receiving each pogo pin for contacting of the plurality of contacts on the device under test in order to make contact with and compress the pogo pins. A three piece assembly is used to accurately position the pogo pins for ease of construction and repair.

8 Claims, 2 Drawing Sheets

SPRING PROBE CONTACTOR FOR TESTING PGA DEVICES

BACKGROUND OF THE INVENTION

FIELD OF THE INVENTION

This invention relates generally to devices for testing electronic components and, more specifically, to a spring probe (pogo pin) contactor device for testing PGA (Programmed Grid Array) devices.

BACKGROUND OF THE INVENTION

A PGA device, like other electronic devices, requires testing to ensure high quality of the finished product. In the past, in order to test a PGA device, the extending pins of the PGA device were inserted into a contactor, and the contactor was coupled to a DUT (Device Under Test) board which was coupled to the testing machine. The DUT board was, essentially, a printed circuit board that completed the electrical circuit between the PGA device pins via the contactor and the testing machine. In general, in order to test a PGA device, the testing machine would send signals to and receive signals from the PGA device via the electrical conductor paths provided by the contractor and the DUT board.

The contactor usually contains a plurality of spring probes which are sometimes referred to as pogo pins, and therefore, these types of contactors are referred to as spring probe contactors. Double ended spring probes, hereinafter referred to as spring probes or pogo pins, are well know in the art, and they typically provide a shaft with a compressible portion at both ends of the shaft. Thus, when a plurality of spring probes located within a contactor are compressed by the insertion of a plurality of PGA device pins onto the contactor or by other contact elements such as C4 solder balls, these spring probes provide electrical contact between each of the pins or contact elements of the PGA device and the different electrical contact pins on the DUT board.

A problem of major concern with this approach has been the overdriving of the PGA devices being inserted onto the spring probe contactor. Oftentimes, when an automatic handler inserts the PGA device onto the spring probe contactor, the handler overdrives the insertion of the PGA device which results in the over compression of many of the spring probes located in the spring probe contactor. In fact, in many cases, the flexible ends of the spring probes are compressed to the point that they get stuck in the shaft of the spring probes, thereby resulting in a complete loss of flexibility for the overcompressed spring probes and a resultant loss of electrical continuity. Replacing damaged spring probes in the spring probe contactor is a timely process, and, in addition, it is an expensive one based upon the high cost of replacing spring probes.

Therefore, there existed a need to provide a spring probe contactor which facilitates manufacture and maintenance of the spring probes in the contactor where the pins of a PGA device contact the probes for testing purposes.

BRIEF SUMMARY OF THE INVENTION

It is therefore an object of this invention to provide a probe contactor that facilitates the assembly and maintenance of the contactor.

In accordance with one embodiment of this invention, a spring probe contactor for testing PGA (Pin Grid Array) devices that facilitates positioning of pogo pins within the contactor device is disclosed comprising, in combination, a PGA device having a plurality of device contacts, terminals or C4 balls on its surface for connection with the spring probe contactor in order to test the PGA device. The contactor has at least a three piece construction, the first component provides an outer surface of the spring probe contactor having an array of apertures for receiving each of the pogo pins which extend above the surface of the first component to make contact with the device under test. Whereby the device of the device makes contact with and compress the pogo pins. The first component has a recess cavity on the inner surface for mating with the second component. The second component is smaller than the first component and its outer dimension conforms to the recess cavity of the first component to mate therein. The second component acts as a positioning device having a plurality of apertures or holes that are aligned with the apertures or holes of the first component. Each of the apertures or holes in the second component has a diameter which is greater than those in the first component and of sufficient size to receive and hold the wider dimension of the body of the spring pogo pins. The third component is similar to the first component and provides an outer surface of the contactor having an array of apertures or holes axially aligned with the first and second components for receiving each of the pogo pins. The dimension of the apertures or holes of the third component may be the same as that of the first component but smaller than the apertures or holes of the second component in order to retain the pogo pins. Each pogo pin is thereby positioned within the contactor and may be contacted on the surface of the third component by the tester. The inner surface of the third component may have a recess cavity of the same dimension as the first component for mating with the second component. As may now be understood, the contactor may be easily assembled by placing the second component within the recess cavity of the first component. The pogo pins may then be placed in each apertures or holes. Finally, the third component is placed over the first and second components with the pogo pins in place. The completed assembly may be secured together to complete the contactor device.

In accordance with this invention, a method for testing semiconductor devices using a spring probe contactor that limits compression of pogo pins within the spring probe contactor is provided comprising the steps of placing a device under test having a plurality of terminals extending therefrom onto a plurality of the spring probes carried within the contactor in order to make contact with and compress the pogo pins for testing the device. The surface of the first component limits the contact of the device with the spring probe contactor. If maintenance is required the third component may be removed and any of the damaged pogo pins may be easily removed and replaced in the second component.

The foregoing and other objects, features, and advantages of the invention will be apparent from the following, more particular, description of the preferred embodiments of the invention, as illustrated in the accompanying drawings.

DETAILED DESCRIPTION OF THE INVENTION

Figure 1:
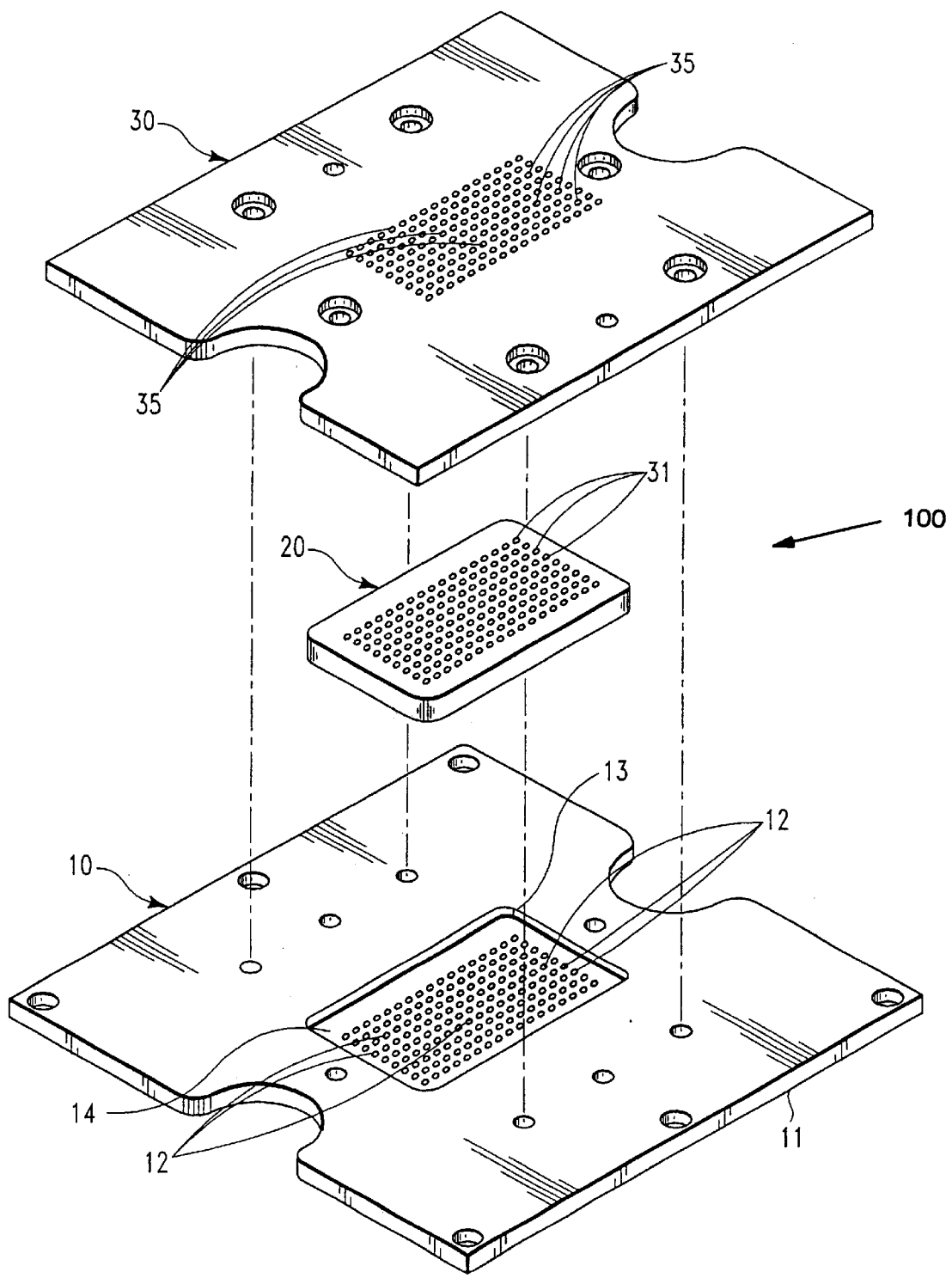
FIG. 1 is on exploded perspective view of the interface structures in accordance with the present invention.

Contactor 100 in accordance with the present invention is illustrated in FIG. 1. The contactor has three major components a top plate 10, positioning plate 20 and bottom plate 30. The top plate 10 has a recessed portion 13 which forms a cavity. Within the cavity are a plurality of holes or 12 that pass through the inner surface 14 to the outer surface 11 of the top plate 10. The positioning plate 20 is configured to fit snugly into the cavity formed by the recessed portion 13 of the top plate 10, whereby the plate 20 is accurately positioned in plate 10. The positioning plate 20 has holes 31 that are aligned co-axial with the holes 12 of the top 10. Holes 31 have a wider diameter than holes 12 to accommodate the wider body portion of spring biased pogo pins which are placed within positioning plate 20 within plate 10. As now should be understood these plates may be separately constructed and machined to close tolerances to provide the necessary alignment of the pogo pins within the contactor. In one embodiment the bottom plate 30 has two parallel surfaces that has holes 35 which are co-axial with holes 31 and 12 to accurately position the bottom plate 30, top plate 10, positioning plate 20 with the pogo pins ends extending beyond the outside surface of the bottom plate. The holes 35 are of a smaller diameter than holes 31 in order to retain the pogo pins in place. The assembly of the three components with the pogo pins within the positioning plate 20 form the contactor device 100 which outward appearance would be similar to FIG. 2. The major contactor components are preferably constructed of a non-conducting material such as fiberglass, plastic or the like in order to electrically separate the conducting pogo pins.

Figure 2:
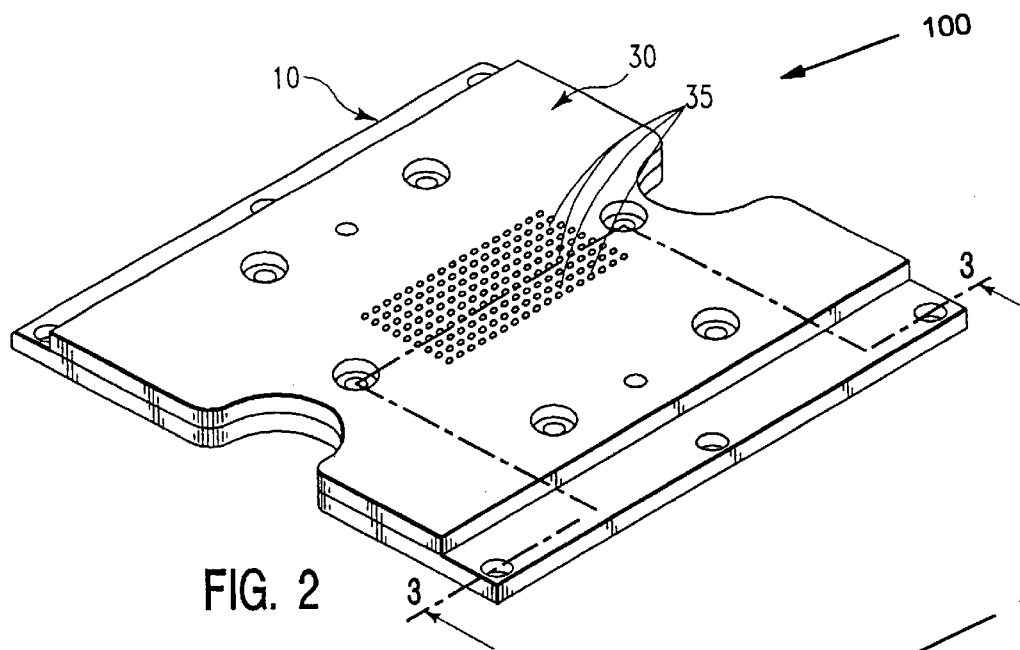
FIG. 2 is an assembled perspective view of the interface in accordance with the present invention.
Figure 3:
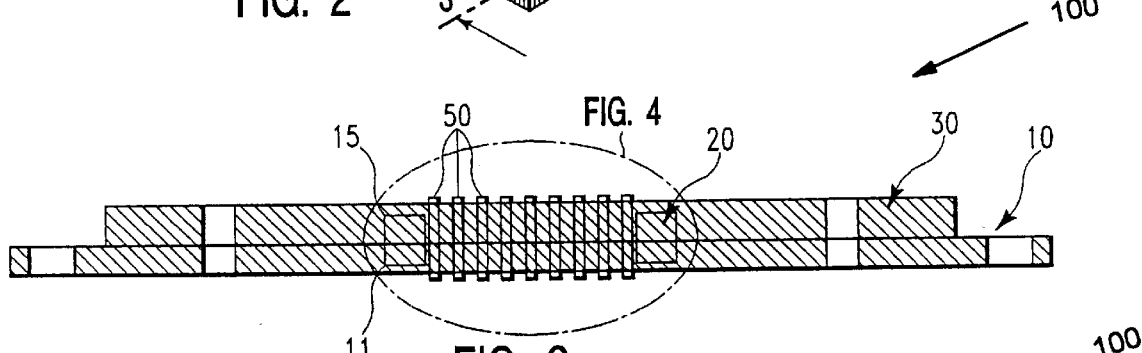
FIG. 3 is a sectional side view thru 3—3 of FIG. 2.
Figure 4:
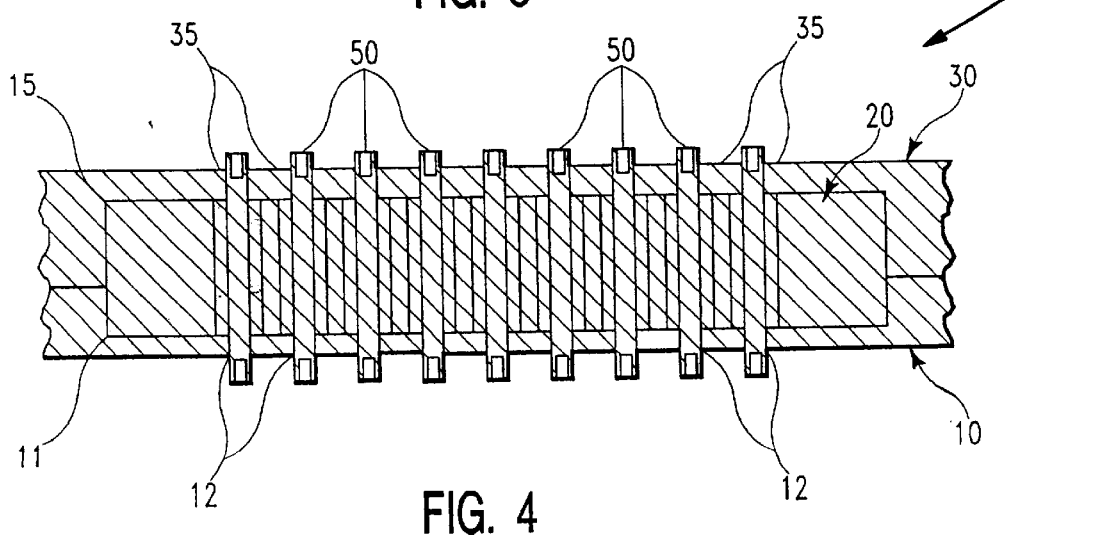
FIG. 4 is an enlarged side view thru 4—4 of FIG. 3.

Another embodiment is illustrated in FIGS. 2 through 4 which uses the same numerals used as those used in the description FIG. 1. As previously indicated the positioning plate 20 is positioned to fit within the cavity formed by the recess 11 of the top plate 10. However in this embodiment bottom plate 30 has a similar recess 15. The combination of recess 11 and recess 15 form a cavity into which the positioning plate 20 is placed. In this manner the positioning plate is used as a guide to mate top plate 10 with bottom plate 30. The probe contactor may be assembled by first mating the bottom plate 30 with the positioning plate 20 and then inserting the pogo pins 50. The top plate 10 may then be positioned on top and secured to the lower plate 30. As can be realized each part may be separately fabricated with accurate dimensions to facilitate the assembly. This assembly may be held by screws which may be removed to perform maintenance of the contactor. The assembly and maintenance of the contractor clearly has numerous variations that are possible that do not depart from the spirit and scope of the inventive principles. Accordingly, limitations should be imposed only in conformance to the appended claims and their equivalents.

What is claimed is:

1. A self-aligning contractor assembly for testing semiconductor devices or device under test (DUT) comprising:

a first plate with parallel bottom and top planar surfaces with a recessed portion on the bottom surface wherein the recessed portion has a plurality of small apertures of uniform size passing through both the top and bottom recessed surface;

a second positioning plate having outer sidewalls around the periphery and a top and bottom planar surfaces which are parallel to the surfaces of the first plate and a plurality of small apertures extending through the bottom and top surfaces that are axially aligned with the aperture in the first plate;

a third alignment plate positioned between said first plate and said second plate wherein the third alignment plate with top and bottom parallel planar surfaces that has an outer peripheral sidewalls that conformly fits within the recessed cavity formed by the recessed area of the first plate and having a plurality of large apertures that are axially aligned with said smaller apertures of the first and second plate; and a plurality of pogo pins that are biased at both ends and are loosely positioned within said aperture of the first and third plate such that the ends of said pogo pins extend beyond the top and bottom surfaces of the first and second plate.

2. The contactor of claim 1 wherein the pogo pins have a cylindrical shape having end portions that have a narrow diameter and a central portion that have a wider diameter that contains a spring which buses the end portions which extend outwardly outside the contactor.

3. The contactor of claim 2 wherein the aperture of the third plate is wider than the aperture than the wider central portion of the pogo pins.

4. The contactor of claim 3 wherein the aperture of the first and second plate is wider than the narrow diameter of the end portion of the pogo pins and narrower than the wider diameter of the central portion of the pogo pins.

5. The contactor of claim 1 wherein the second plate has a recessed portion on the top surface which has the same dimensions of the recessed portion of the first plate.

6. The contactor of claim 5 wherein the third plate has outer peripheral sidewalls that conformly fits within the recessed cavity formed by the recess area of the second plate.

7. The contactor of claim 5 wherein the first, second and third plates are constructed of non-conducting material.

8. A method for assembling a self aligning contactor comprising the steps of:

a) positioning a third alignment plate having a plurality of wide holes within a recessed portion of a first plate having narrow holes axially aligned with the wide holes of the third alignment plate;

b) placing pogo pins in the holes of the first and third alignment plate;

c) positioning a second plate having narrow holes aligned axially with the wide hole of the third alignment plate to accommodate and loosely position the pogo pins such that the third alignment plate is positioned between the first and second plate; and d) removablely mounting the first plate to the second plate in order that the contactor may be easily diassembled.

* * * * *